US010965062B1

(12) United States Patent
Miller et al.

(10) Patent No.: US 10,965,062 B1
(45) Date of Patent: Mar. 30, 2021

(54) MODULAR ELECTRICAL CONNECTOR WITH CONDUCTIVE COATING TO REDUCE CROSSTALK

(71) Applicant: TE Connectivity Services GmbH, Schaffhausen (CH)

(72) Inventors: Keith Edwin Miller, Manheim, PA (US); Kyle Gary Annis, Hummelstown, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/830,687

(22) Filed: Mar. 26, 2020

(51) Int. Cl.
| H01R 4/66 | (2006.01) |
| H01R 13/6471 | (2011.01) |
| H01R 13/6587 | (2011.01) |
| H05K 1/02 | (2006.01) |
| H01R 13/514 | (2006.01) |
| H01R 13/6473 | (2011.01) |

(52) U.S. Cl.
CPC ....... *H01R 13/6471* (2013.01); *H01R 13/514* (2013.01); *H01R 13/6473* (2013.01); *H01R 13/6587* (2013.01); *H05K 1/0218* (2013.01); *H05K 2201/10189* (2013.01)

(58) Field of Classification Search
CPC ....... H05K 1/0218; H05K 2201/10189; H01R 13/6471; H01R 13/514; H01R 13/6473; H01R 13/6587
USPC .................................................. 439/92–108
See application file for complete search history.

(56) References Cited

U.S. PATENT DOCUMENTS

| 6,171,115 | B1 | 1/2001 | Mickievicz et al. |
| 6,267,604 | B1 | 7/2001 | Mickievicz et al. |
| 6,384,341 | B1 | 5/2002 | Rothermel et al. |
| 6,488,549 | B1 | 12/2002 | Weller et al. |
| 6,540,522 | B2 | 4/2003 | Sipe |
| 6,582,250 | B2 | 6/2003 | Taylor et al. |
| 6,638,110 | B1 * | 10/2003 | Billman ............ H01R 13/6471 439/607.07 |
| 6,655,966 | B2 | 12/2003 | Rothermel et al. |
| 6,663,426 | B2 | 12/2003 | Hasircoglu et al. |
| 6,663,442 | B1 | 12/2003 | Helster et al. |
| 6,676,450 | B2 | 1/2004 | Schroll |
| 6,705,895 | B2 | 3/2004 | Hasircoglu |
| 6,808,399 | B2 | 10/2004 | Rothermel et al. |
| 6,811,414 | B1 | 11/2004 | Consoli et al. |
| 6,811,440 | B1 | 11/2004 | Rothermel et al. |
| 6,824,391 | B2 | 11/2004 | Mickievicz et al. |

(Continued)

*Primary Examiner* — Khiem M Nguyen (57) ABSTRACT

An electrical connector for use in an electrical connector system which controls cross talk, signal radiation and impedance. The electrical connector includes a plurality of modules having mating ends and mounting ends. Each of the modules of the plurality of modules has a conductive first housing. The first housing has at least one second housing recess and ground contact receiving channels provided in a first surface of the first housing. At least one second housing is provided in the at least one second housing recess. The at least one second housing is made of insulative material and has signal contact receiving channels provided in a first surface of the at least one second housing. Signal contacts are positioned in the signal contact receiving channels of the at least one second housing. Ground contacts are positioned in the ground contact receiving channels of the first housing.

20 Claims, 10 Drawing Sheets

(56) References Cited

U.S. PATENT DOCUMENTS

| | | |
|---|---|---|
| 6,890,214 B2 | 5/2005 | Brown et al. |
| 6,932,649 B1 | 8/2005 | Rothermel et al. |
| 6,945,810 B1 | 9/2005 | Morana et al. |
| 6,964,583 B2 | 11/2005 | D'Ambrosia et al. |
| 6,997,736 B2 | 2/2006 | Costello et al. |
| 7,044,794 B2 | 5/2006 | Consoli et al. |
| 7,175,445 B2 | 2/2007 | Consoli et al. |
| 8,840,431 B2 | 9/2014 | Nguyen et al. |
| 10,535,971 B2 | 1/2020 | Annis et al. |
| 10,833,455 B2 * | 11/2020 | Chang ................ H01R 13/405 |
| 10,840,649 B2 * | 11/2020 | Gailus ............... H01R 13/6461 |

* cited by examiner

MODULAR ELECTRICAL CONNECTOR WITH CONDUCTIVE COATING TO REDUCE CROSSTALK

FIELD OF THE INVENTION

The present invention relates to a modular connector with reduced crosstalk. In particular, the invention relates to a modular connector with surfaces which have a conductive coating applied to an insulative member optimized for impedance.

BACKGROUND OF THE INVENTION

Due to the increasing complexity of electronic components, it is desirable to fit more components in less space on a circuit board or other substrate. Consequently, the spacing between electrical terminals within connectors has been reduced, while the number of electrical terminals housed in the connectors has increased, thereby increasing the need in the electrical arts for electrical connectors that are capable of handling higher and higher speeds and to do so with greater and greater pin densities. It is desirable for such connectors to have not only reasonably constant impedance levels, but also acceptable levels of impedance and cross-talk, as well as other acceptable electrical and mechanical characteristics. Therefore, there remains a need to provide appropriate shielding to preserve signal integrity and to minimize crosstalk as speeds of signals increase as the footprint of the connector maintains or increases density of the signal pairs.

It would, therefore, be beneficial to provide a connector which reduces crosstalk between contact pairs. In addition, it would be beneficial to provide a such connector which can be manufactured in a manner, such as by applying a conductive coating to an insulative member of the housing which is optimized for impedance.

SUMMARY OF THE INVENTION

An embodiment is directed to an electrical connector for use in an electrical connector system which controls cross talk and signal radiation and optimizes impedance. The electrical connector includes a plurality of modules having mating ends and mounting ends. Each of the modules of the plurality of modules has a conductive first housing having. The first housing has at least one second housing recess provided in a first surface of the first housing. The first housing has ground contact receiving channels provided in the first surface of the first housing. At least one second housing is provided in the at least one second housing recess. The at least one second housing is made of insulative material and has signal contact receiving channels provided in a first surface of the at least one second housing. Signal contacts are positioned in the signal contact receiving channels of the at least one second housing. Ground contacts are positioned in the ground contact receiving channels of the first housing.

An embodiment is directed to an electrical connector for use in an electrical connector system which controls cross talk and signal radiation and optimizes impedance. The electrical connector includes a plurality of modules having mating ends and mounting ends. Each of the modules of the plurality of modules has a conductive first housing. The first housing has at least one second housing recess and ground contact receiving channels. At least one second housing is provided in the at least one second housing recess. The at least one second housing is made of insulative material and has signal contact receiving channels. Signal contacts are positioned in the signal contact receiving channels of the at least one second housing. The signal contacts are arranged in pairs to carry differential signals. Ground contacts are positioned in the ground contact receiving channels of the first housing. Respective ground contacts of the ground contacts are positioned adjacent to the at least one second housing and respective signal contacts of the signal contacts.

An embodiment is directed to an electrical connector for use in an electrical connector system which controls cross talk and signal radiation and optimizes impedance. The electrical connector includes a plurality of modules having mating ends and mounting ends. A first housing has at least one second housing recess provided in a first surface of the first housing. The first housing has ground shield receiving channels provided in a second surface of the first housing. The ground shield receiving channels are aligned with the at least one second housing recess. At least one second housing is provided in the at least one second housing recess. The at least one second housing is made of insulative material and has signal contact receiving channels. Signal contacts are positioned in the signal contact receiving channels of the at least one second housing. The signal contacts are arranged in pairs to carry differential signals. Ground shield plates are positioned in the ground shield receiving channels of the first housing to engage grounding contacts of a mating connector.

Other features and advantages of the present invention will be apparent from the following more detailed description of the illustrative embodiment, taken in conjunction with the accompanying drawings which illustrate, by way of example, the principles of the invention.

DETAILED DESCRIPTION OF THE INVENTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

FIGS. 1 through 7 illustrate an electrical connector system 10 formed in accordance with an illustrative embodiment. The electrical connector system 10 includes a backplane connector 12 and a daughtercard connector 14 that are used to electrically connect a backplane circuit board (not shown) and a daughtercard circuit board (not shown). While the electrical connector system 10 is described herein with reference to backplane connectors 12 and daughtercard connectors 14, it is realized that the subject matter herein may be utilized with different types of electrical connectors other than a backplane connector or a daughtercard connector. The backplane connector 12 and the daughtercard connector 14 are merely illustrative embodiments of an electrical connector system 10 that interconnects a particular type of circuit board, namely a backplane circuit board, with a daughtercard circuit board.

In the illustrative embodiment shown, the daughtercard connector 14 constitutes a right angle connector wherein a mating interface 16 and mounting interface 18 of the daughtercard connector 14 are oriented perpendicular to one another. The daughtercard connector 14 is mounted to the daughtercard circuit board at the mounting interface 18. Other orientations of the interfaces 16, 18 are possible in alternative embodiments.

Figure 1:
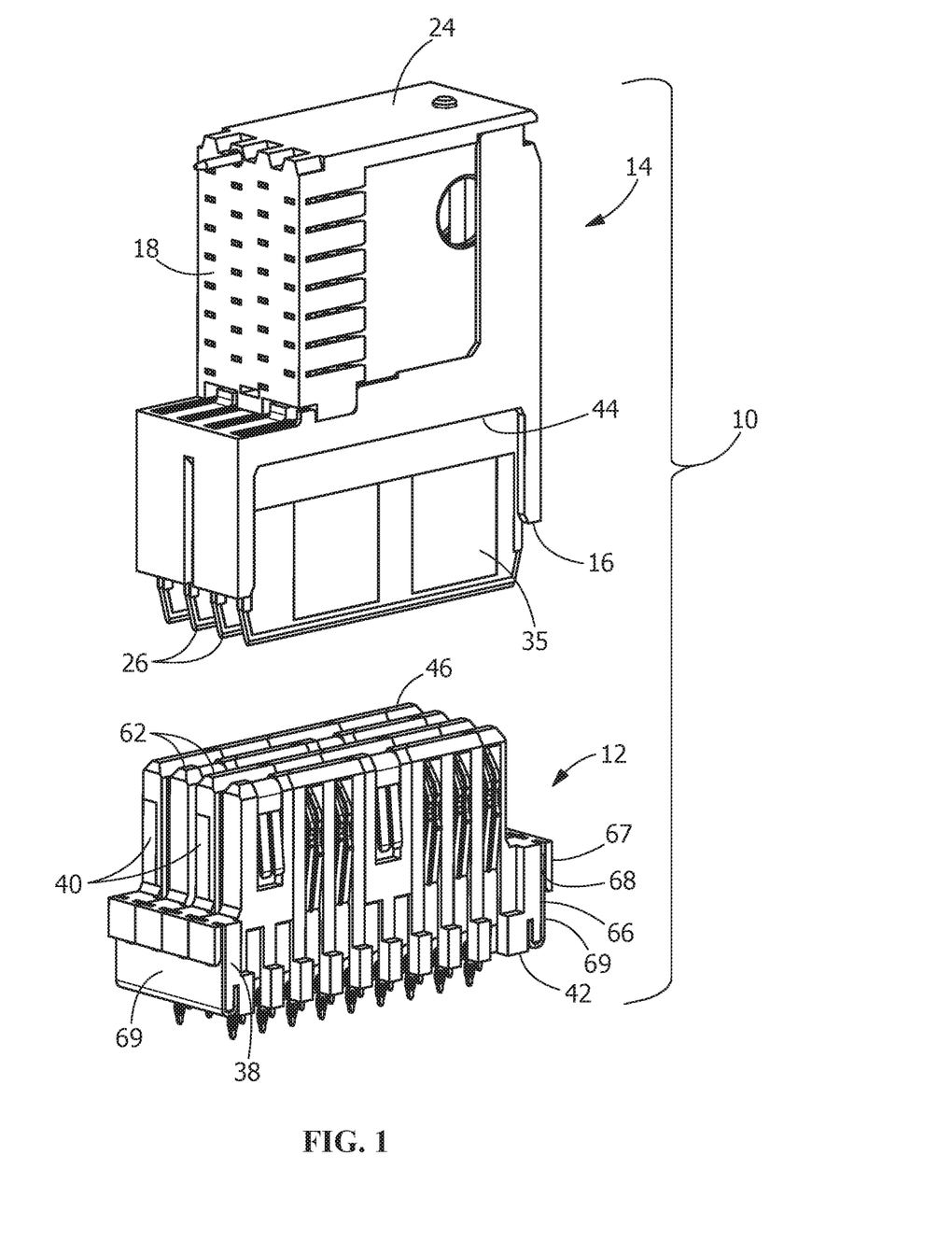
FIG. 1 is a front perspective view of an illustrative embodiment of a connector system shown in an unassembled position, with a backplane connector and a mating daughtercard connector positioned above the backplane connector prior to mating therewith.
Figure 2:
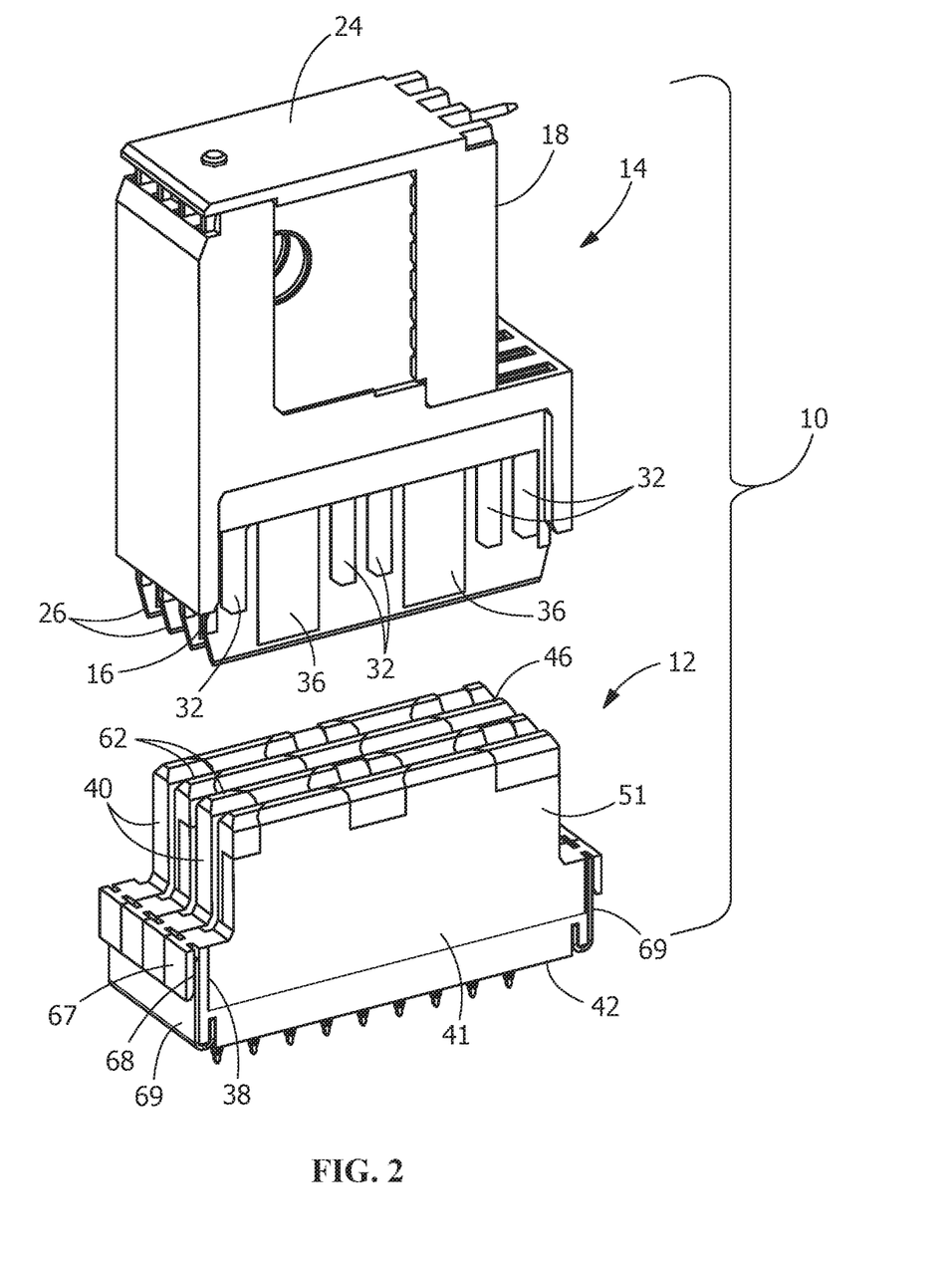
FIG. 2 is a back perspective of the connector system shown in FIG. 1.
Figure 4:
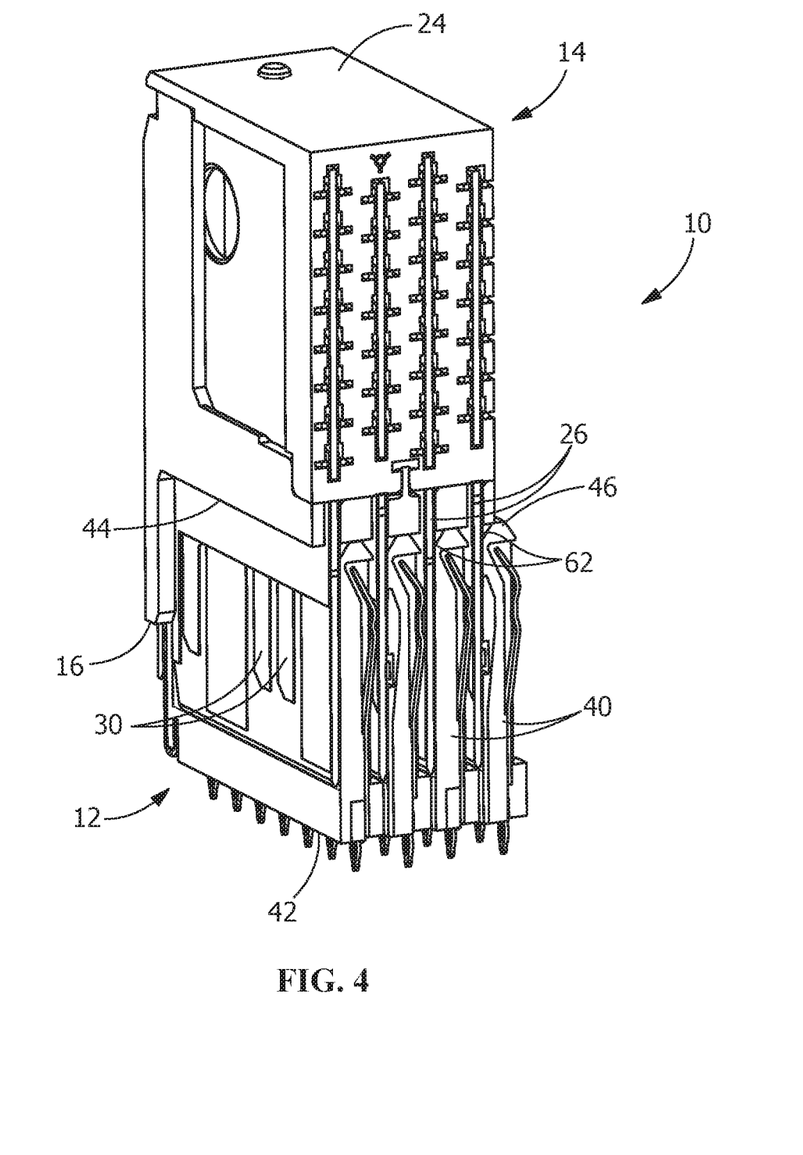
FIG. 4 is a perspective cross-sectional view of the daughtercard connector mated with the backplane connector, taken along line 4-4 of FIG. 3.

As shown in FIGS. 1, 2 and 4, the daughtercard connector 14 includes a housing 24, made of one or more components, holding a plurality of circuit boards 26 therein. The circuit boards 26 have pairs 28 of individual signal pathways or traces (not shown) that extend between the mating interface 16 and the mounting interface 18. The signal traces have signal conductive pads 32 provided proximate the mating interface 16. The signal traces are configured to be mated with and electrically connected to the signal contacts 48 of the backplane connector 12. The circuit boards 26 have individual ground pathways or traces that extend between the mating interface 16 and the mounting interface 18. The ground traces (not shown) have ground conductive pads 36 provided proximate the mating interface 16. The ground traces are configured to be mated with, and electrically connected to, the ground contacts 50 or the shield or ground plates 52 of the backplane connector 12. The circuit boards 26 also have ground pathways or traces 35 on opposites sides of the circuit boards 26 from the ground traces. The ground traces 35 extend between the mating interface 16 and the mounting interface 18. In alternative embodiments, the circuit boards 26 may be contact modules, the signal traces may be mating signal contacts and the ground traces may be ground contacts.

In the illustrated embodiment, the backplane connector 12 constitutes a header connector mounted to the backplane circuit board. The backplane connector 12 is mated to the daughtercard connector 14. When mated, the daughtercard circuit board is oriented generally perpendicular with respect to the backplane circuit board.

The backplane connector 12 includes a mating end 46 and a mounting end 42 that are oriented generally parallel to one another. The backplane connector 12 is mounted to the backplane circuit board at the mounting end 42.

The backplane connector 12 includes a housing 38 which includes a plurality of modules 40. Each of the modules 40 has a mating end 46, also referred to herein as a front end 46, that is positioned in a recess 44 of the daughtercard connector 14 during mating. Each of the modules 40 has a mounting end 42, also referred to herein as a rear end 42, which is mounted to the backplane circuit board. Each of the modules 40 holds a plurality of individual signal contacts 48 that extend between the mating end 46 and the mounting end 42. In an exemplary embodiment, the signal contacts 48 are arranged in pairs carrying differential signals. Each of the modules 40 also holds a plurality of ground contacts 50 that extend between the mating end 46 and the mounting end 42.

Figure 5:
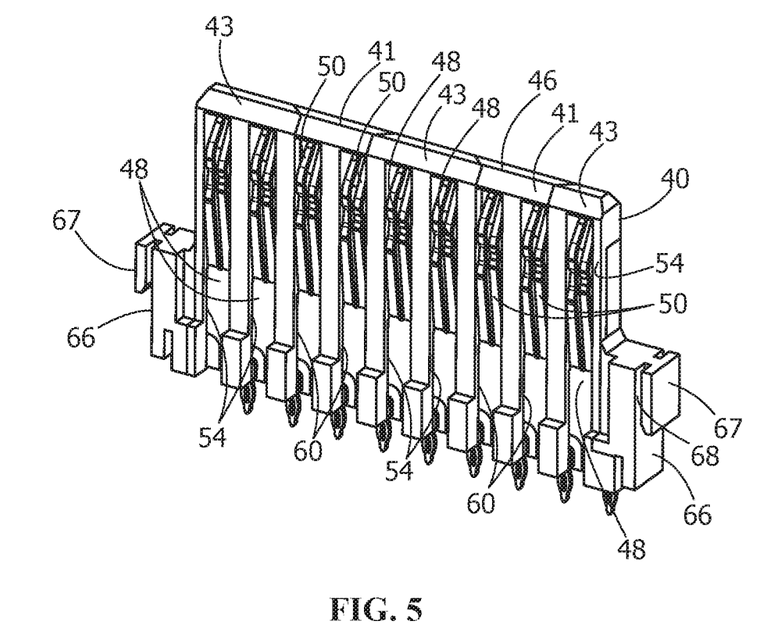
FIG. 5 is a front perspective view of an illustrative embodiment of a module of the backplane connector.
Figure 6:
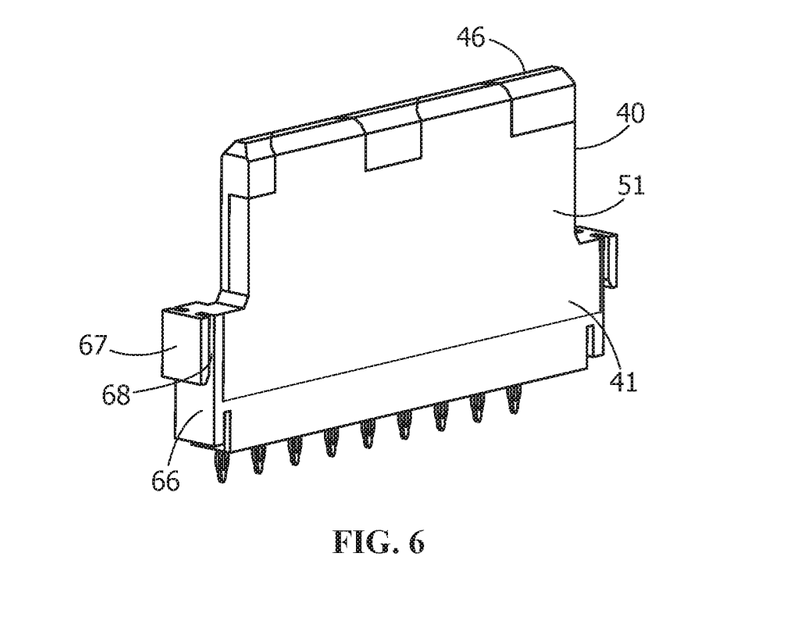
FIG. 6 is a back perspective view of an illustrative embodiment of the module of FIG. 5.
Figure 7:
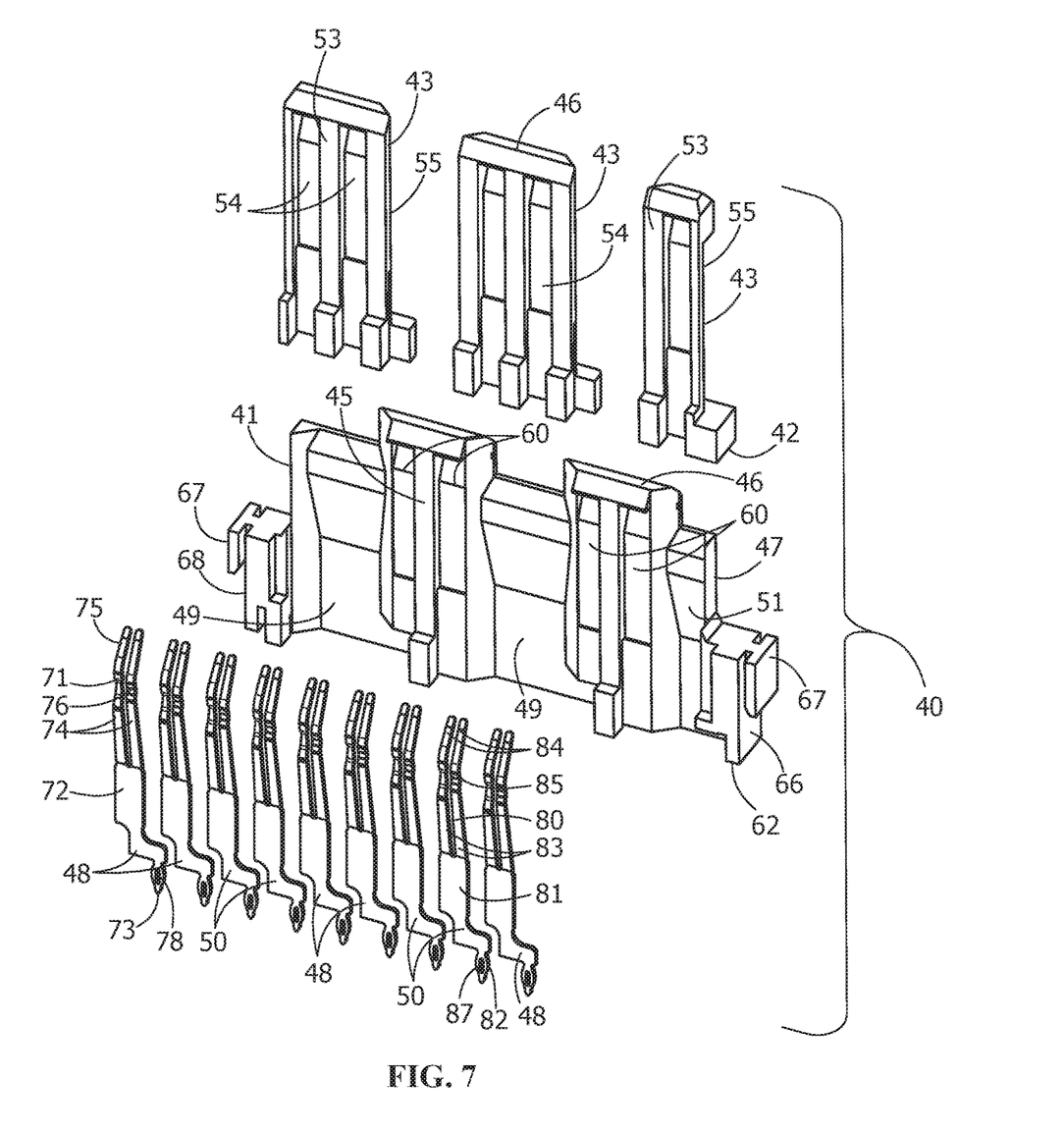
FIG. 7 is an exploded perspective view of the module of FIG. 5.

As shown in FIGS. 5 through 7, each module 40 has a conductive first housing 41 and at least one second housing 43. In the illustrative embodiment shown, three second housings 43 are provided, but other numbers and configurations of the second housings 43 may be provided.

Each of the conductive first housings 41 has a first surface 45 and an oppositely facing second surface 47. At least one second housing receiving recess 49 extends from the first surface 45 toward the second surface 47. The first housing 41 is an insulative member made of an insulative material with a conductive coating 51 applied to the outer surfaces of the first housing 41. The conductive coating 51 may be applied by known methods or processes, including, but not limited to, an electroless process, an electroplating process or a physical vapor deposition process. The conductive coating 51 allows the first housing 41 to act as a shield, as will be more fully described, while allowing the modules 40 and the backplane connector 12 to mate with existing daughtercard connectors 14. As the first housing 41 is made from an insulative materials, such as, but not limited to, plastic, the shape of the first housing 41 can be molded or manufactured in a shape which optimizes the impedance characteristics of the first housing 41 when the conductive coating 51 is applied.

The conductive first housings 41 of the modules 40 include a plurality of ground cavities or channels 60 extending between the mating end 46 and the mounting end 42 of the first surface 45. The ground channels 60 extend from the first surface 45 toward the second surface 47 along the mating axes and receive the ground contacts 50. When the backplane connector 12 and daughtercard connector 14 are mated, ground conductive pads 36 of the ground traces of the daughtercard connector 14 are also received in the ground channels 6. Any number of ground channels 60 may be provided. The ground channels 60 may be provided at any locations within the modules 40 and the housing 38. In an exemplary embodiment, the ground channels 60 are generally positioned adjacent to and/or between the second housing receiving recesses 49.

The second housings 43 have a first surface 53 and an oppositely facing second surface 55. The second housings 43 are insulative members made of an insulative material. The second housings 43 may be separate components which are assembled to the first housings 41 using known methods, such as, but not limited to, adhesion, interference fit, overmolding and/or mounting projections.

The second housings 43 of the modules 40 include a plurality of signal cavities or channels 54 extending between the mating end 46 and the mounting end 42 of the first surface 53. The signal channels 54 extend along the mating axes and receive the signal contacts 48. When the backplane connector 12 and daughtercard connector 14 are mated, the signal conductive pads 32 of the mating signal traces of the daughtercard connector 14 are also received in the signal channels 60. In the illustrative embodiment shown, two signal cavities or channels 54 are provided in each of the second housings 43, however, other numbers of signal cavities or channels 54 may be provided.

In the illustrative embodiment shown in FIGS. 1 and 2, the housing 38 of the backplane connector 12 has four modules 40 which are positioned adjacent to each other. However, other number of modules may be used. Circuit board receiving slots 62 are provided between adjacent modules 40. The circuit board receiving slots 62 are positioned adjacent mating connector receiving sections 64 of the modules 40. Each circuit board receiving slot 62 extends from the mating end 46 of the module toward the mounting end 42.

Each of the first housings 41 of the modules 40 has a base section 66 which extends from the mounting end 42 toward the mating end 46. The base section 66 has end sections 67 which extend beyond the connector receiving sections 64, as shown in FIGS. 5 and 6. Each of the end sections 67 has a clip receiving slot 68 which extends from a top surface 65 of the end section 67 toward the mounting end 42.

Figure 3:
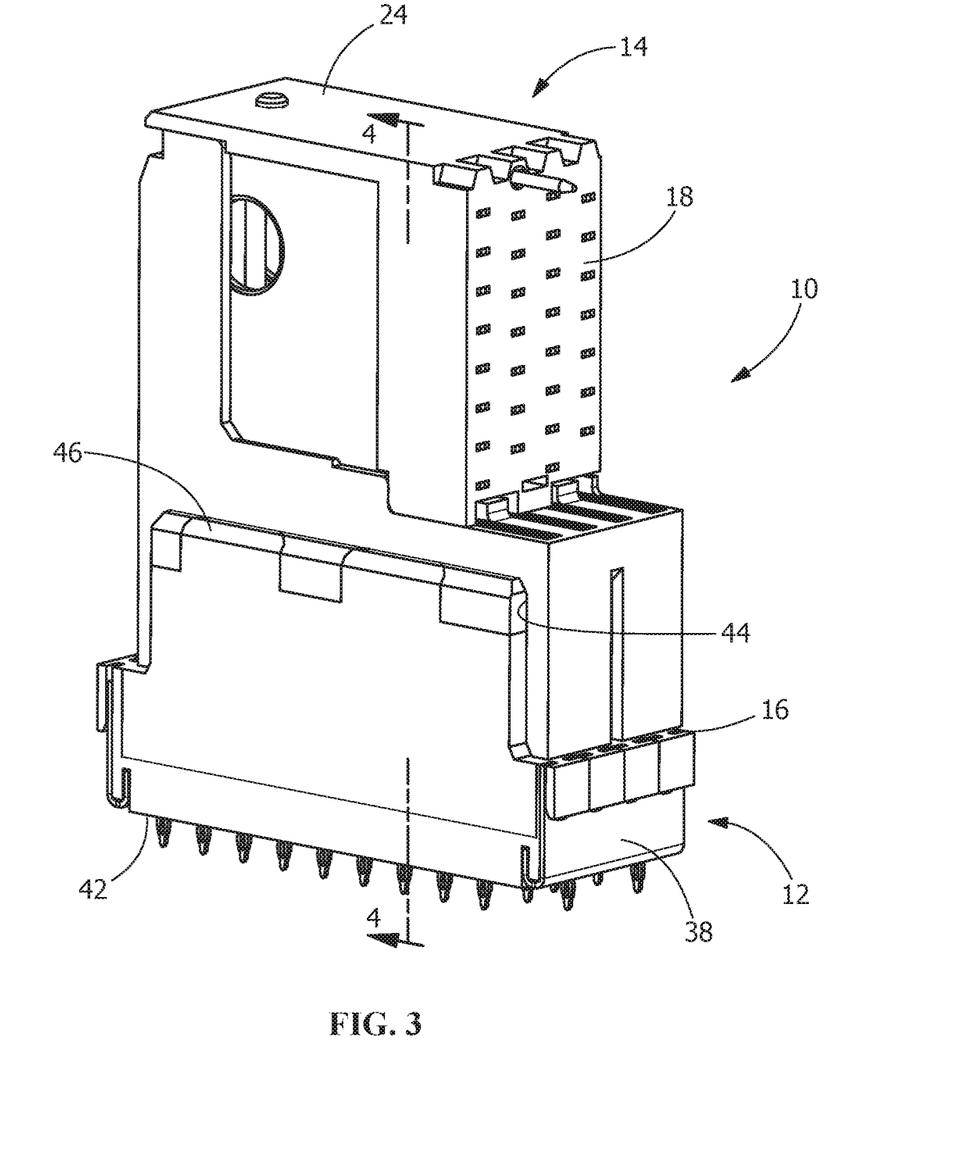
FIG. 3 is a perspective view of the backplane connector mated with the daughtercard connector.

When the modules 40 are properly assembled, as shown in FIGS. 1 through 3, clips 69 are inserted into the clip receiving slots 68 to properly position and retain the modules 40 in position relative to each other.

Referring to FIGS. 5 and 7, the signal channels 54 and ground channels 60 are shown. As previously described, the signal channels 54 are configured to receive the signal contacts 48 therein. As shown in FIG. 7, each signal contact 48 has a mating contact receiving section 71, a securing section 72 and circuit board mounting section 73. In the illustrative embodiment shown, the contact receiving section 71 includes two resilient arms 74 with lead in portions 75 and engagement portions 76. The resilient arms 74 are configured to press against the signal conductive pads 32 of the signal traces when the daughter card connector 14 is mated to the backplane connector 12. The circuit board mounting section 73 has a compliant portion 78, such as an eye of the needle pin, although other configurations may be used. Each of the circuit board mounting section 73 has a longitudinal axis which is offset from the longitudinal axis of the securing section 72 and the mating contact receiving section 71. In various illustrative embodiments, the signal contacts 48 of one module 40 have the circuit board mounting section 73 offset to the right, while the signal contacts 48 of another module 40 have the circuit board mounting section 73 offset to the left. As the mounting section 73 of the signal contacts 48 in one module 40 are offset from the mounting section 73 of the signal contacts 48 in an adjacent module 40, the crosstalk is reduced in the footprint of the backplane connector 12, as the staggered pattern is configured for cancellation.

As previously described, the ground channels 60 are configured to receive the ground contacts 50 therein. Each ground contact 50 has a contact section 80, a securing section 81 and circuit board mounting section 82. In the illustrative embodiment shown, the contact section 80 includes two resilient arms 83 with lead in portions 84 and engagement portions 85. The resilient arms 83 are configured to press against the ground conductive pads 36 of the ground traces when the daughter card connector 14 is mated to the backplane connector 12.

The circuit board mounting section 82 has a compliant portion 87, such as an eye of the needle pin, although other configurations may be used. Each of the circuit board mounting section 82 has a longitudinal axis which is offset from the longitudinal axis of the securing section 81 and the contact section 80. In various illustrative embodiments, the ground contacts 50 of one module 40 have the circuit board mounting section 82 offset to the right, while the ground contacts 50 of another module 40 have the circuit board mounting section 82 offset to the left.

With the housing 38 properly assembled, the ground contacts 50 and the conductive first housings 41 with the conductive coatings 51 extend about the periphery of the pairs of signal contacts 48 and surround the pairs of signal contacts 48 to provide electrical shielding for the pairs of signal contacts 48. Respective ground contacts 50 are positioned adjacent to the at least one second housing 43 and respective signal contacts 48. In an exemplary embodiment, entire, 360 degree shielding is provided by the ground contacts 50 and the conductive first housings 41 along the length of the signal contacts 48. The ground contacts 50 and the conductive first housings 51 surround portions of the mating signal traces when the connectors 12, 14 are mated. The ground contacts 50 and the conductive first housings 41 provide shielding along the entire mating interface with the mating signal traces. The ground contacts 50 and the conductive first housings 41 may control electrical characteristics throughout the housing 38, such as by controlling cross talk, signal radiation, impedance or other electrical characteristics.

With the daughtercard connector 14 properly mated to the backplane connector 12, the circuit boards 26 of the daughter card connector 14 are positioned in the circuit board receiving slots 62. In this position, the signal contacts 48 of the modules 40 physically and electrically engage the signal conductive pads 32 of the signal traces of the circuit boards 26. The ground contacts 50 of the modules 40 are also placed in physical and electrical engagement with the ground conductive pads 36 of the ground traces of the circuit boards 26. In addition, the conductive first housings 41 physically and electrically engage the ground contacts 50.

The ground contacts 50 and the conductive first housings 41 provide shielding for the signal contacts 48 and the portions of the signal conductive pads 32 of the signal traces of the circuit boards 26 which are positioned in the circuit board receiving slots 62 of the modules 40 of the housing 38 of the backplane connector 12.

Figure 8:
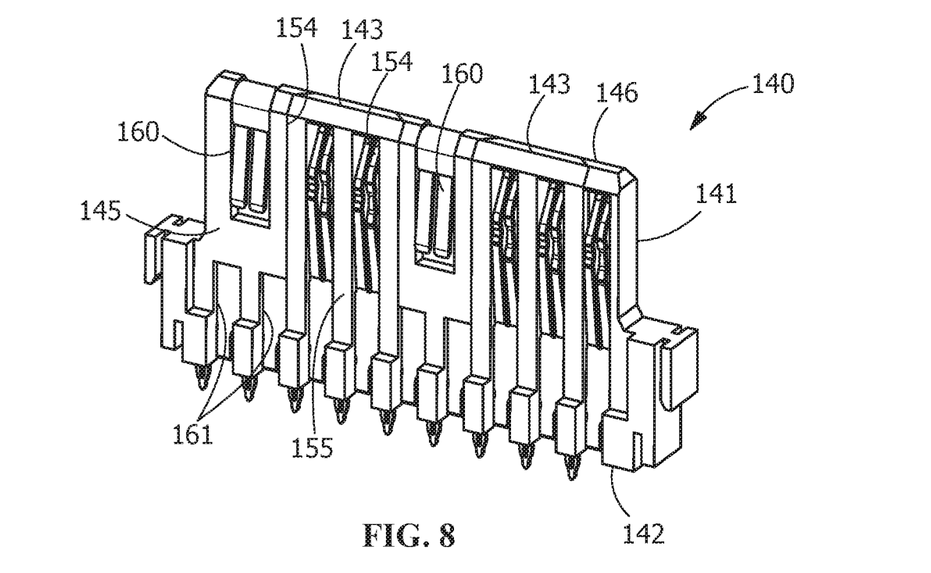
FIG. 8 is a front perspective view of a first alternate illustrative embodiment of a module of the backplane connector.
Figure 9:
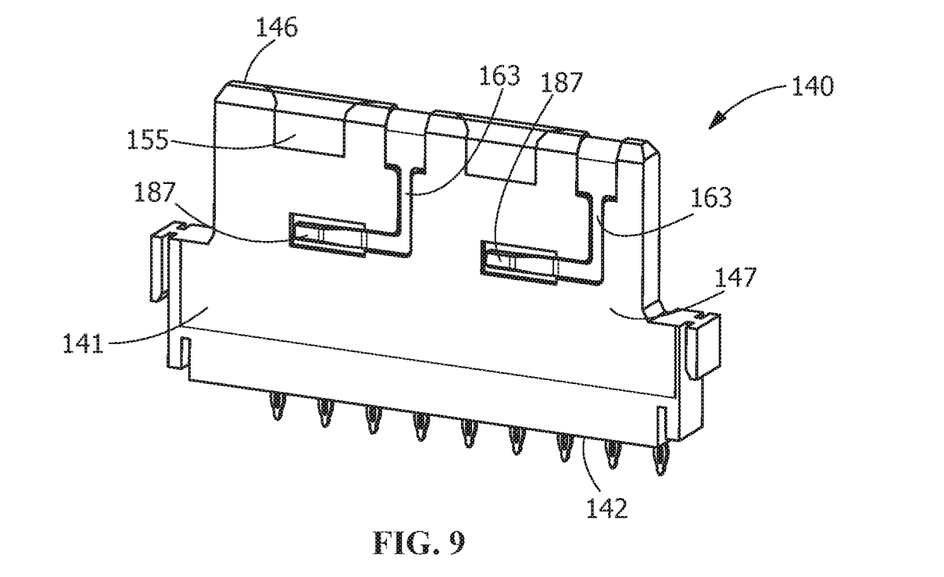
FIG. 9 is a back perspective view of an illustrative embodiment of the module of FIG. 8.
Figure 10:
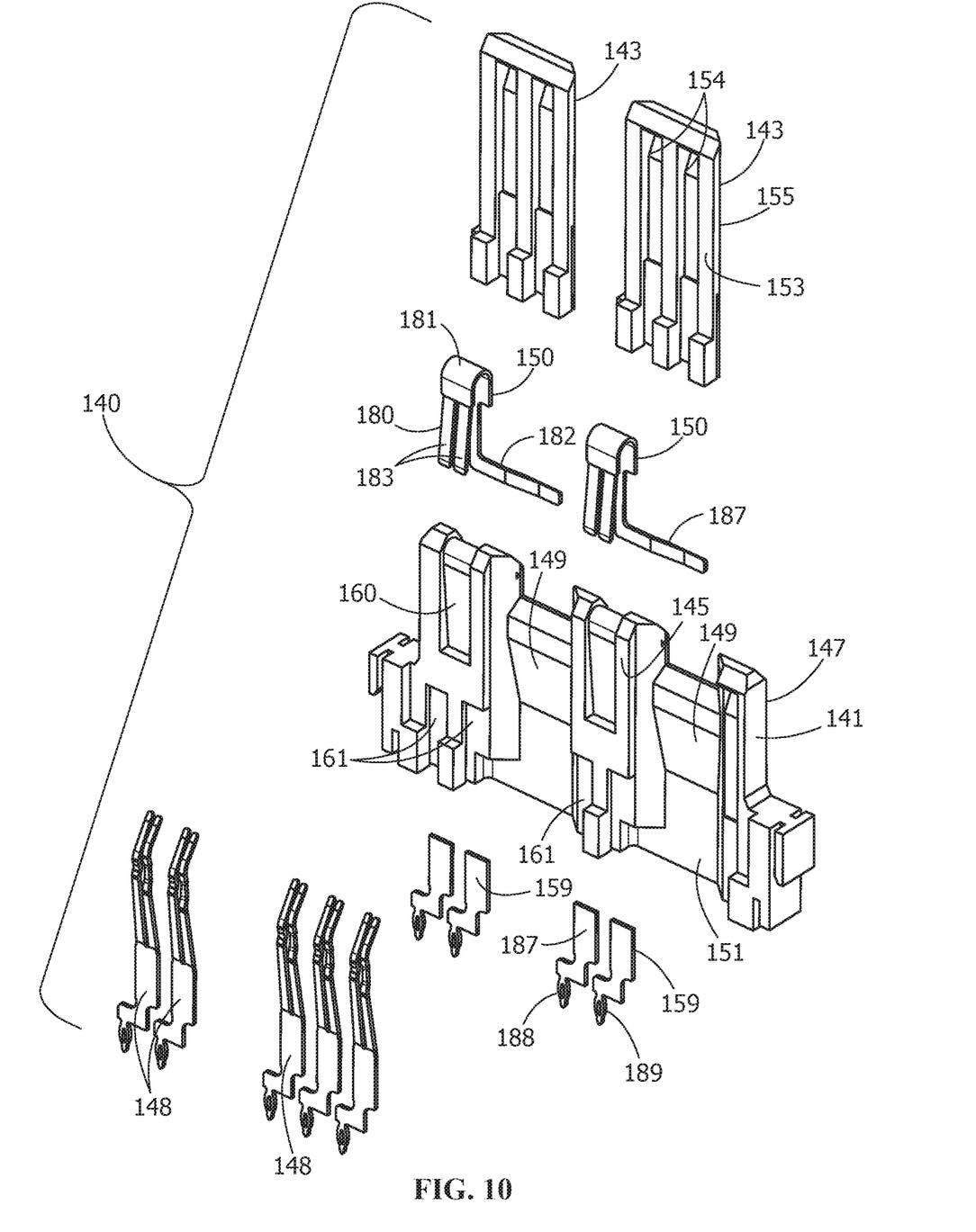
FIG. 10 is an exploded perspective view of the module of FIG. 8.

Referring to FIGS. 8 through 10, a first alternate illustrative embodiment of a module 140 is shown. Each module 140 has a conductive first housing 141 and at least one second housing 143. In the illustrative embodiment shown, two second housings 143 are provided, but other numbers and configurations of the second housings 143 may be provided.

As shown in FIG. 10, each of the conductive first housings 141 has a first surface 145 and an oppositely facing second surface 147. At least one second housing receiving recess 149 extends from the first surface 145 toward the second surface 147. The first housing 141 is an insulative member made of an insulative material with a conductive coating 151 applied to the outer surfaces of the first housing 141. The conductive coating 151 may be applied by known methods or processes, including, but not limited to, an electroless process, an electroplating process or a physical vapor deposition process. The conductive coating 151 allows the first housing 141 to act as a shield, as will be more fully described, while allowing the modules 140 and the backplane connector 12 to mate with existing daughtercard connectors 14. As the first housing 141 is made from an insulative materials, such as, but not limited to, plastic, the shape of the first housing 141 can be molded or manufactured in a shape which optimizes the impedance characteristics of the first housing 141 when the conductive coating 151 is applied.

The conductive first housings 141 of the modules 140 include a plurality of first ground cavities or channels 160 and second ground cavities or channels 161 extending from the first surface 145 toward the second surface 147. When the backplane connector 12 and daughtercard connector 14 are mated, ground conductive pads 36 of the ground traces of the daughtercard connector 14 are also received in the ground channels 160. Any number of first ground channels 160 and second ground channels 161 may be provided. The ground channels 160 and second ground channels 161 may be provided at any locations within the modules 140. In an exemplary embodiment, the ground channels 160 and second ground channels 161 are generally positioned adjacent to and/or between the second housing receiving recesses 149.

The conductive first housings 141 of the modules 140 also include a plurality of third ground cavities or channels 163 extending from the second surface 147 toward the first surface 145. The third ground cavities or channels 163 intersect with the first cavities or channels 160 proximate the mating end 146.

The second housings 143 have a first surface 153 and an oppositely facing second surface 155. The second housings 143 are insulative members made of an insulative material. The second housings 143 may be separate components which are assembled to the first housings 141 using known methods, such as, but not limited to, adhesion, interference fit, overmolding and/or mounting projections.

The second housings 143 of the modules 140 include a plurality of signal cavities or channels 154 extending between the mating end 146 and the mounting end 142. The signal channels 154 extend along the mating axes and receive the signal contacts 148. When the backplane connector 12 and daughtercard connector 14 are mated, the signal conductive pads 32 of the mating signal traces of the daughtercard connector 14 are also received in the signal channels 154. In the illustrative embodiment shown, two signal cavities or channels 154 are provided in each of the second housings 143, however, other numbers of signal cavities or channels 154 may be provided.

As previously described, the signal channels 154 are configured to receive the signal contacts 148. The signal contacts 148 are similar to the signal contacts 48 previously described.

The ground channels 160 and ground channels 163 are configured to receive the ground contacts 150 therein. Each ground contact 150 has a first contact section 180, a bent or securing section 181 and a second contact section 182. In the illustrative embodiment shown, the first contact section 180 has two resilient arms 183. The resilient arms 183 are configured to press against the ground conductive pads 36 of the ground traces when the daughter card connector 14 is mated to the backplane connector 12.

The bent section 181 extends between the first contact section 180 and the second contact section 182. The bent section 181 also extends between the first ground cavities or channels 160 on the first surface 145 and the third ground cavities or channels 163 on the second surface 147. The second contact sections 182 have projection 187 which extend beyond the second surface 147 to physically and electrically engage the ground traces 35 of the circuit boards 26.

The ground channels 161 are configured to receive the ground contacts 159 therein. Each ground contact 159 has a module engagement section 187 and a circuit board mounting section 188. The circuit board mounting section 188 has a compliant portion 189, such as an eye of the needle pin, although other configurations may be used.

With the housing 38 properly assembled, the ground contacts 150 and the conductive first housings 141 with the conductive coatings 151 extend about the periphery of the pairs of signal contacts 148 and surround the pairs of signal contacts 148 to provide electrical shielding for the pairs of signal contacts 148. Respective ground contacts 150 are positioned adjacent to the at least one second housing 143 and respective signal contacts 148. In an exemplary embodiment, entire, 360 degree shielding is provided by the ground contacts 150 and the conductive first housings 141 along the length of the signal contacts 148. The ground contacts 150 and the conductive first housings 151 surround portions of the mating signal traces when the connectors 12, 14 are mated. The ground contacts 150 and the conductive first housings 141 provide shielding along the entire mating interface with the mating signal traces. The ground contacts 150 and the conductive first housings 141 may control electrical characteristics throughout the housing 38, such as by controlling cross talk, signal radiation, impedance or other electrical characteristics.

Figure 11:
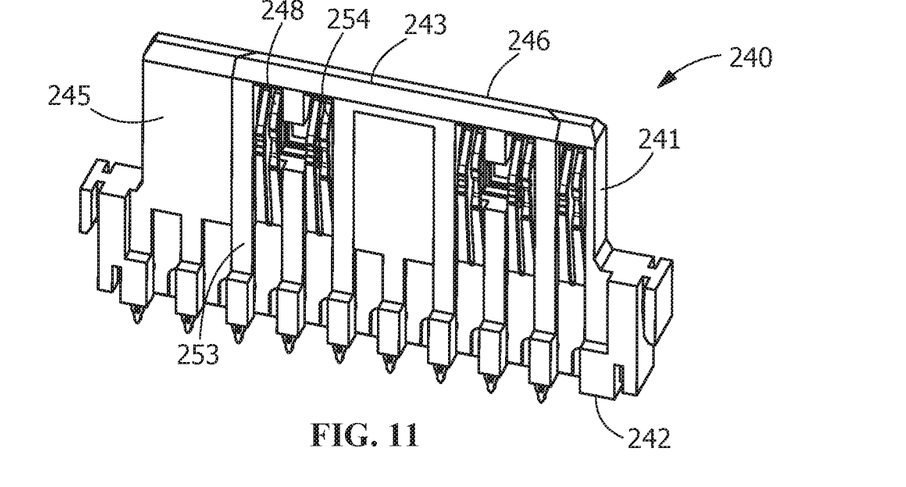
FIG. 11 is a front perspective view an illustrative second embodiment of a module which can be used in a connector system.
Figure 12:
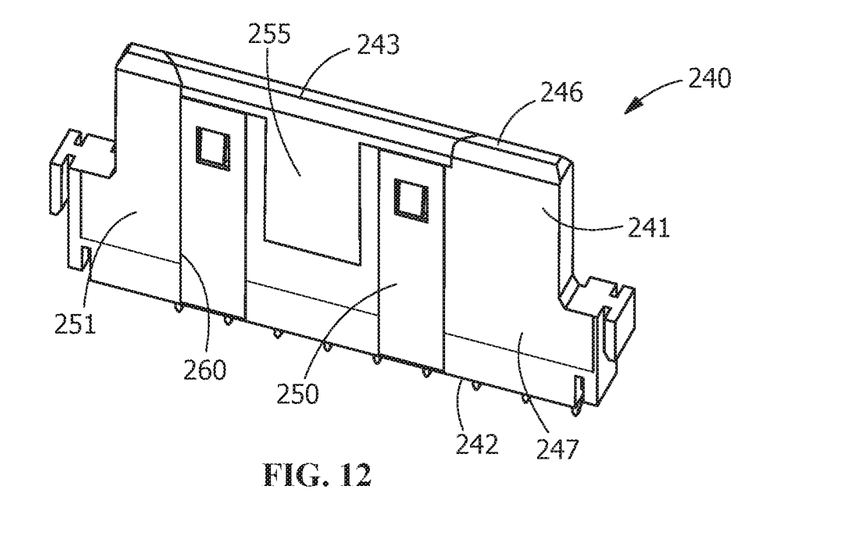
FIG. 12 is a back perspective view of the module of FIG. 11.
Figure 13:
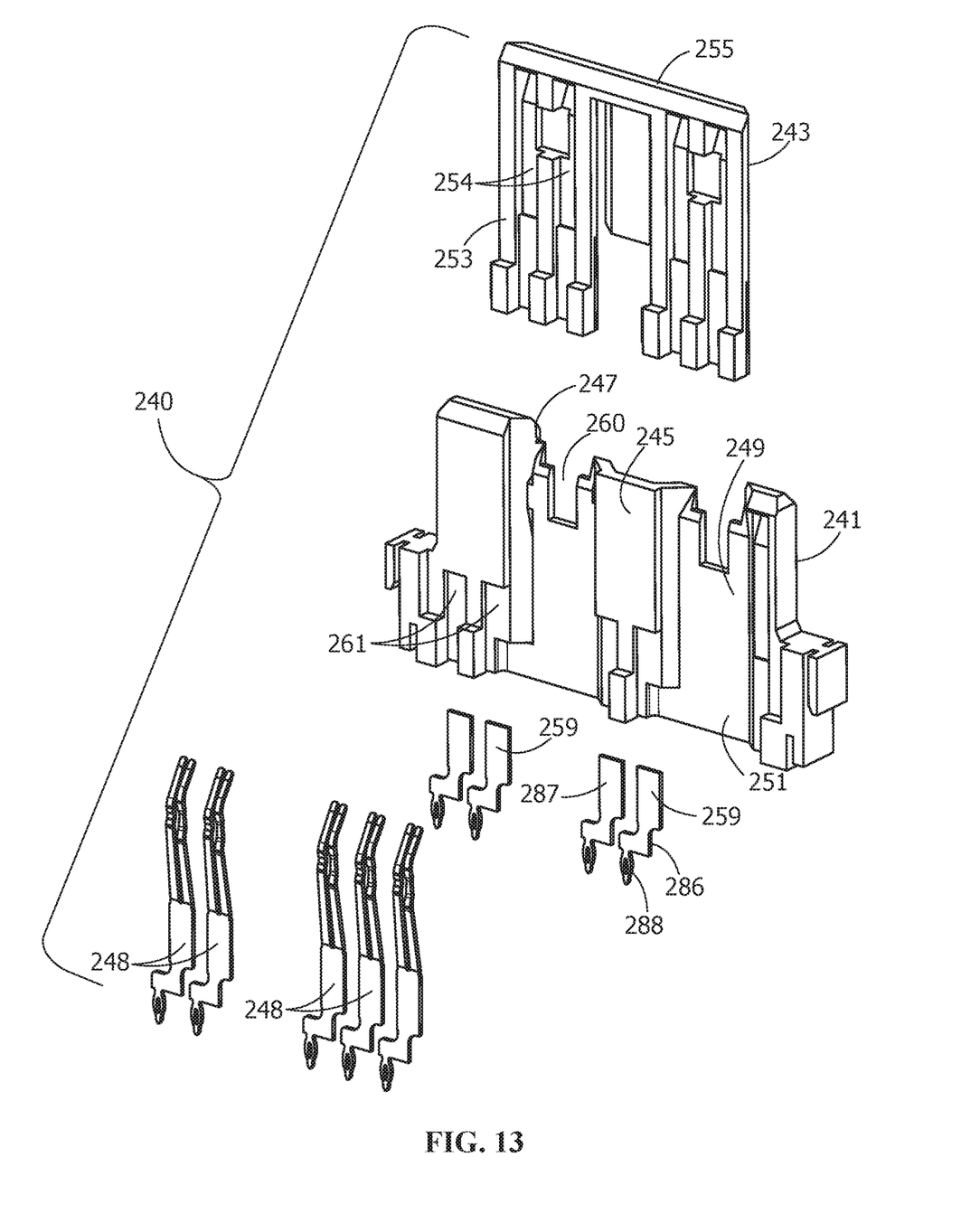
FIG. 13 is an exploded perspective view of the module of FIG. 11.

Referring to FIGS. 11 through 13, a second alternate illustrative embodiment of a module 240 is shown. Each module 240 has a conductive first housing 241 and at least one second housing 243.

The conductive first housing 241 has a first surface 245 and an oppositely facing second surface 247. At least one second housing receiving recess 249 extends from the first surface 245 toward the second surface 247. The first housing 241 is an insulative member made of an insulative material with a conductive coating 251 applied to the outer surfaces of the first housing 241. The conductive coating 251 may be applied by known methods or processes, including, but not limited to, an electroless process, an electroplating process or a physical vapor deposition process. The conductive coating 251 allows the first housing 241 to act as a shield, as will be more fully described, while allowing the modules 240 and the backplane connector 12 to mate with existing daughtercard connectors 14. As the first housing 241 is made from an insulative materials, such as, but not limited to, plastic, the shape of the first housing 241 can be molded or manufactured in a shape which optimizes the impedance characteristics of the first housing 241 when the conductive coating 251 is applied.

The conductive first housings 241 of the modules 240 include a plurality of ground shield receiving channels or cavities 260 extending from the second surface 247 toward the first surface 245. The ground shield receiving channels 260 are provided in alignment with the second housing receiving recesses 249.

The second housing 243 has a first surface 253 and an oppositely facing second surface 255. The second housing 243 is made of an insulative material. In other embodiments, the second housing 243 may have separate components which are assembled to the first housings 241 using known methods, such as, but not limited to, adhesion, interference fit, overmolding and/or mounting projections.

The second housing 243 of the modules 240 includes a plurality of signal cavities or channels 254 extending between the mating end 246 and the mounting end 242. The signal channels 254 extend along the mating axes and receive the signal contacts 248. When the backplane connector 12 and daughtercard connector 14 are mated, the signal conductive pads 32 of the mating signal traces of the daughtercard connector 14 are also received in the signal channels 254. In the illustrative embodiment shown, two pairs of signal cavities or channels 254 are provided in the second housing 243, however, other numbers of signal cavities or channels 254 may be provided.

As previously described, the signal channels 254 are configured to receive the signal contacts 248. The signal contacts 248 are similar to the signal contacts 48 previously described.

The ground shield receiving channels 260 are configured to receive shield or ground plates 250 therein. In the illustrative embodiment shown, the second housing 243 is overmolded over the shield or ground plates 250. The shield or ground plates 250 are positioned to mechanically and electrically engage the ground traces 35 to provide proper shielding to control cross talk, signal radiation, impedance or other electrical characteristics.

With the housing 38 properly assembled, the shield or ground plates 250 and the conductive first housings 241 with the conductive coatings 251 extend about the periphery of the pairs of signal contacts 248 and surround the pairs of signal contacts 248 to provide electrical shielding for the pairs of signal contacts 248. In an exemplary embodiment, entire, 360 degree shielding is provided by the shield or ground plates 250 and the conductive first housings 241 along the length of the signal contacts 248. The shield or ground plates 250 and the conductive first housings 251 surround portions of the mating signal traces when the connectors 12, 14 are mated. The shield or ground plates 250 and the conductive first housings 241 provide shielding along the entire mating interface with the mating signal traces. The shield or ground plates 250 and the conductive first housings 241 may control electrical characteristics throughout the housing 38, such as by controlling cross talk, signal radiation, impedance or other electrical characteristics.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. An electrical connector for use in an electrical connector system which controls cross talk, signal radiation and impedance, the electrical connector comprising:
a plurality of modules, the modules having mating ends and mounting ends;
each of the modules of the plurality of modules comprising:
a conductive first housing, the first housing having at least one second housing recess provided in a first surface of the first housing, the first housing having ground contact receiving channels provided in the first surface of the first housing;
at least one second housing provided in the at least one second housing recess, the at least one second housing being made of insulative material, the at least one second housing having signal contact receiving channels provided in a first surface of the at least one second housing;
signal contacts positioned in the signal contact receiving channels of the at least one second housing;
ground contacts positioned in the ground contact receiving channels of the first housing.

2. The electrical connector as recited in claim 1, wherein each of the at least one second housing have a pair of signal contacts to carry differential signals.

3. The electrical connector as recited in claim 1, wherein respective ground contacts of the ground contacts are positioned adjacent to the at least one second housing and respective signal contacts of the signal contacts.

4. The electrical connector as recited in claim 1, wherein the first housing is an insulative member with the conductive coating applied thereto.

5. The electrical connector as recited in claim 1, wherein the conductive coating is applied by a physical vapor deposition process.

6. The electrical connector as recited in claim 1, wherein the conductive coating is applied by a plating process.

7. The electrical connector as recited in claim 1, wherein the first housing has ground contact receiving channels provided in the second surface of the first housing.

8. The electrical connector as recited in claim 7, wherein respective ground contacts of the ground contacts extend from in the ground contact receiving channels provided in the first surface of the first housing to the ground contact receiving channels provided in the second surface of the first housing.

9. The electrical connector as recited in claim 8, wherein the respective ground contacts of the ground contacts which extend from the ground contact receiving channels provided in the first surface of the first housing to the ground contact receiving channels provided in the second surface of the first housing have projections which extend from the second surface to engage grounding contacts of a mating connector.

10. The electrical connector as recited in claim 1, wherein the second housings are overmolded over the first housing.

11. An electrical connector for use in an electrical connector system which controls cross talk, signal radiation and impedance, the electrical connector comprising:
- a plurality of modules, the modules having mating ends and mounting ends;
- each of the modules of the plurality of modules comprising:
  - a conductive first housing, the first housing having at least one second housing recess provided therein, the first housing having ground contact receiving channels;
  - at least one second housing provided in the at least one second housing recess, the at least one second housing being made of insulative material, the at least one second housing having signal contact receiving channels;
  - signal contacts positioned in the signal contact receiving channels of the at least one second housing, the signal contacts being arranged in pairs to carry differential signals;
  - ground contacts positioned in the ground contact receiving channels of the first housing, respective ground contacts of the ground contacts being positioned adjacent to the at least one second housing and respective signal contacts of the signal contacts.

12. The electrical connector as recited in claim 11, wherein the first housing is an insulative member with the conductive coating applied thereto.

13. The electrical connector as recited in claim 12, wherein the conductive coating is applied by a physical vapor deposition process.

14. The electrical connector as recited in claim 12, wherein the conductive coating is applied by an electroplating process.

15. The electrical connector as recited in claim 11, wherein the second housings are overmolded over the first housing.

16. The electrical connector as recited in claim 11, wherein the first housing has ground contact receiving channels provided in the second surface of the first housing.

17. The electrical connector as recited in claim 16, wherein respective ground contacts of the ground contacts extend from in the ground contact receiving channels provided in the first surface of the first housing to the ground contact receiving channels provided in the second surface of the first housing.

18. The electrical connector as recited in claim 17, wherein the respective ground contacts which extend from in the ground contact receiving channels provided in the first surface of the first housing to the ground contact receiving channels provided in the second surface of the first housing have projections which extend from the second surface to engage grounding contacts of a mating connector.

19. An electrical connector for use in an electrical connector system which controls cross talk, signal radiation and impedance, the electrical connector comprising:
- a plurality of modules, the modules having mating ends and mounting ends;
- each of the modules of the plurality of modules comprising:
  - a first housing having a conductive coating, the first housing having at least one second housing recess provided in a first surface of the first housing, the first housing having ground shield receiving channels provided in a second surface of the first housing, the ground shield receiving channels being aligned with the at least one second housing recess;
  - at least one second housing provided in the at least one second housing recess, the at least one second housing being made of insulative material, the at least one second housing having signal contact receiving channels;
  - signal contacts positioned in the signal contact receiving channels of the at least one second housing, the signal contacts being arranged in pairs to carry differential signals;
  - ground shield plates positioned in the ground shield receiving channels of the first housing to engage ground contacts of a mating connector.

20. The electrical connector as recited in claim 19, wherein the ground shield plates have resilient contact arms which beyond the second surface of the first housing to engage the grounding contacts of a mating connector.

* * * * *